United States Patent [19]

Salters et al.

[11] Patent Number: 5,126,822

[45] Date of Patent: Jun. 30, 1992

[54] SUPPLY PIN REARRANGEMENT FOR AN I.C.

[75] Inventors: Roelof H. W. Salters, Eindhoven, Netherlands; Betty Prince, Sugarland, Tex.

[73] Assignee: North American Philips Corporation, New York, N.Y.

[21] Appl. No.: 739,625

[22] Filed: Aug. 2, 1991

Related U.S. Application Data

[63] Continuation of Ser. No. 633,162, Dec. 26, 1990, abandoned, which is a continuation of Ser. No. 360,960, Jun. 2, 1989, abandoned.

[30] Foreign Application Priority Data

Feb. 14, 1989 [EP] European Pat. Off. ........... 89200352

[51] Int. Cl.⁵ ............................................. H01L 23/48
[52] U.S. Cl. ........................................ 357/70; 357/72; 357/74; 174/52.4; 361/421
[58] Field of Search ................. 357/72, 68 M, 70, 41, 357/74, 45; 174/52.4; 361/421

[56] References Cited

U.S. PATENT DOCUMENTS

| | | | |
|---|---|---|---|
| 3,808,475 | 4/1974 | Buelow et al. | 357/47 |
| 4,159,541 | 6/1979 | Ward et al. | 357/74 |
| 4,499,484 | 2/1985 | Tanizawa et al. | 357/68 |
| 4,549,262 | 10/1985 | Chung et al. | 357/45 |
| 4,663,646 | 5/1987 | Ikawa et al. | 357/45 |

FOREIGN PATENT DOCUMENTS

| | | |
|---|---|---|
| 0074825 | 3/1983 | European Pat. Off. |
| 0151870 | 8/1985 | European Pat. Off. |
| 0205728 | 12/1986 | European Pat. Off. |
| 0138650 | 5/1989 | European Pat. Off. |
| 0001856 | 1/1985 | Japan ..................... 357/74 |
| 0104673 | 5/1986 | Japan ..................... 357/68 |
| 0240077 | 10/1988 | Japan ..................... 357/68 |

OTHER PUBLICATIONS

J. Bond, "TJ's pinout scheme for ACL devices", Computer Design, vol. 25, No. 21, Nov. 15, 1986 pp. 28–32.
Philips Data Handbook IC 10, 1987, p. 103 and IC 14, 1987, pp. 34, 322.
National Semiconductor Data book, 1989, pp. 1–3 thru 1–5, and 5–3 thru 5–4.
Patent Abstracts of Japan, vol. 8, No. 272 (E-284) [1709] Dec. 13, 1984 (JP-A-59 144 155 Nippon Denki K. K.)
Archer Semiconductor Replacement Guide, 1981 Ed. Cat. No. 276-4004 pp. 50,61,71,75.
Hitachi IC Memories Data Book, #M10 pp. 199, 288, 385 & 391.
Intel Memory Components Handbook, 1984 Order Number 210830-003, pp. 3-275-277,286.
High Density Chip Carriers and Sockets, Dimity Grabbe, Solid State Technology, Apr. 1983, pp. 257-258.

Primary Examiner—Rolf Hille
Assistant Examiner—David Ostrowski
Attorney, Agent, or Firm—Lesley Rhyne

[57] ABSTRACT

An IC is provided with supply pins extending beyond the chip's encapsulation. The location of the supply pins is chosen so as to minimize the length of the associated bonding wires. Moreover the supply pins are located next to each other so as to reduce the effective inductance of the associated bonding wires. Output pins connected with on-chip buffers are located next to the supply pins so as to reduce the length of the buffer's supply lines, giving rise to a further reduction is inductive parasitic effects.

22 Claims, 3 Drawing Sheets

SUPPLY PIN REARRANGEMENT FOR AN I.C.

BACKGROUND OF THE INVENTION

This is a continuation of application Ser. No. 633,162 filed Dec. 26, 1990, now abandoned, which is a continuation of application Ser. No. 360,960 filed Jun. 2, 1989 now abandoned. 1. Field of the Invention The invention relates to an integrated circuit being coupled to connection pins via conductive connections, among which connection pins there is at least one first supply pin for connection to a first supply voltage and at least one second supply pin for connection to a second supply voltage.

2. Prior Art

Integrated circuits of this kind are widely known, for example in an encapsulated form, the connection pins extending beyond the encapsulation.

According to the current art in I.C.-technology, it is possible to realize on a substrate structures having minimum dimensions in the order of magnitude of a tenth of a micron. However, the ever progressing miniaturization entails an increasing susceptibility of circuits to electrical parasitic effects. An example of such effects are the inductive voltage fluctuations on the chip's internal supply lines caused by the circuit's activity on the one hand and the bonding wires' and supply pins' inductances on the other hand. A major factor limiting the switching speed of digital circuitry is the occurrence of these inductive voltage fluctuations, which may have a detrimental effect on the I.C.

The encapsulation of I.C.'s, e.g. microprocessors or memories, wherein the supply pins are located diametrically opposite to one another, is a widely accepted standard. Reference is made to Philips Data Handbook IC10, 1987, page 103, showing the pinning diagram for a SRAM, and to Philips Data Handbook IC14, page 322, showing the pinning diagram for a microcontroller. However, as the miniaturization goes on and the maximum of the clock frequency tends to increase, the drawbacks of this standard become more apparent. For instance, a smoothing capacitance, according to common practice located between the first supply pin and the second supply pin, necessarily needs long wires to cover the distance between the supply pins located diametrically. The parasitic impedance of these wires diminishes the efficiency of the smoothing capacitance. Also, such long wires are liable to act as antennae for receiving or transmitting disturbances interfering with the circuitry.

Furthermore, an inductive loop comprising the chip, whereon the bonding pads for the bonding wires connected to the supply pins are located, the bonding wires and the supply pins themselves, has a considerable inductance because of its relatively large area. This causes the occurrence of inductive voltage spikes on the chip's internal supply lines, which spikes may interfere with the operation of the integrated circuit. Moreover, the series arrangement of a supply pin and an associated bonding wire has an electrical path length that is the longest possible in the conventional dual-in-line I.C. This causes the impedance thereof, in particular the inductance, to be the largest possible.

Conventional pin arrangement other than that of the dual-in-line arrangement entail similar drawbacks. For example, in the pinning arrangement of the microcontroller, shown in Philips Data Handbook IC14, 1987, page 34, the connection pins are located along the circumference of the I.C. Two supply pins are provided at opposite sides of the I.C. Consequently, a smoothing capacitor connected between the supply pins creates a relatively large loop likewise. Other arrangements of connection pins may comprise connection pins arranged in a grid having more than two columns and more than two rows. Such a grid arrangement allows a large density of pins, which in particular is advantageous for I.C.'s that consume more power. Especially in high power-consumption environment, where currents and current changes are large, the operation may be limited by the above inductive effect.

SUMMARY OF THE INVENTION

Therefore, it is an object of the invention to provide an integrated circuit being less susceptible to said parasitic effects. To this end an integrated circuit according to the invention is characterized, in that an aggregated electrical path length of each supply pin and of the conductive connection between the circuit and the supply pin is equal to or shorter than an aggregated electrical path length of any of the connection pins not being a supply pin and the conductive connection between the circuit and the relevant connection pin not being a supply pin. The inductance of the series arrangement of a supply pin and its associated conductive connection now is the lowest possible.

An embodiment of an integrated circuit according to the invention is characterized, in that the first supply pin and the second supply pin are located next to one another. By locating the first and second supply pins next to one another, the area of the loop described herein above is further decreased considerably, thus minimizing the inductances. Another advantage of this supply pin arrangement is, that the associated bonding wires and supply pins conduct currents in an antiparallel orientation. This causes the common effective inductance of this arrangement of supply pins and associated bonding wires to be less than half of the inductance of a single bonding wire due to a substantial cancellation of electro-magnetic fields generated by the inductances of the neighbouring wires.

A further embodiment of an integrated circuit according to the invention is characterized, in that there are provided at least two first supply pins and at least two second supply pins. This architecture decreases the amplitude of disturbances of the chip's internal supply lines even more because the present of at least two supply pins and wires per supply voltage reduces the current per supply path by at least a factor 2.

A still further embodiment according to the invention, wherein the connection pins comprise an output pin for transmitting an output signal, is characterized, in that said output pin is located next to one of said supply pins. Embedded in a data processing system a plurality of other circuitry may be interconnected to said output pins. Each of the other circuits and the interconnections thereto represent impedances. Therefore output pins for transmitting output signals to other circuitry usually carry more powerful signals than other pins. By arranging the output pins in the immediate proximity of said supply pins the distance between the chip and the output pins is only slightly greater than the distance between the chip and the supply pins. As a consequence the inductance of the relevant wires and the output pins is only slightly larger in magnitude. Moreover, the effects of large currents and rapid current changes have only small effect on the supply voltages at the supply pins, for the latter are well protected by their pairwise presence. An even more important advantage of the arrangement of the output pins in the immediate neighbourhood of the supply pins is that now the output buffers for transmitting the output signals at the output pins are fed via short supply lines. This causes the amplitude of inductive voltage spikes due to large current changes during the buffer's operation to be smaller than the amplitude of spikes occurring in a conventional integrated circuit in similar circumstances.

A still further embodiment of an integrated circuit wherein the connection pins further comprise control pins such as a clock-input, or a chip-enable, or a read-enable or a write-enable, or an output-enable or a program-enable, according to the invention, is characterized in that the control pins are located nearer to a predetermined supply pin than connection pins not being a supply pin or output pin. By locating control pins, such as clock pins and enable pins in the immediate proximity of the paired supply pins a core of pins has been created. The pins forming said core are present in almost all I.C.'s. Chip designers may therefore take such a core as a starting point for creating a circuit, which is less sensitive to inductive interferences and generates much less of such inductive voltage spikes. Extensions of circuits designed according to the invention are easily accomplished, for the locations of the bulk of the pins and therefore the main parts of the lay-out are predetermined. For memories in particular this way of designing has important advantages as the memory cell matrices differ only in size, but not in lay-out.

According to the experiments conducted on a memory according to the invention, the amplitude of disturbing voltages caused by switching were lower by a factor 4 á 5 than a memory conventionally supplied.

BRIEF DESCRIPTION OF THE DRAWINGS

The invention will be illustrated by way of example with reference to a drawing, in which.

DETAILED DESCRIPTION OF THE PREFERRED EMBODIMENTS

Figure 1:
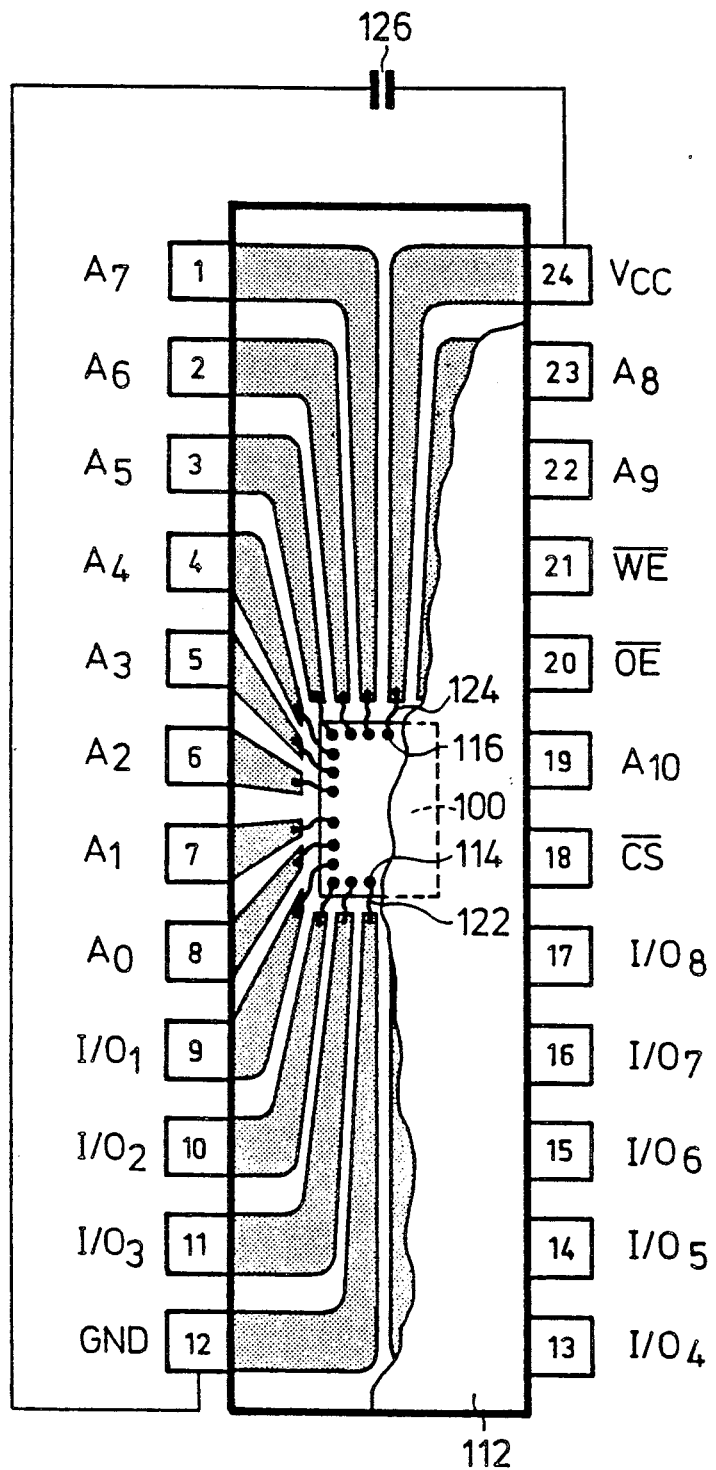
FIG. 1 presents the pin arrangement of a conventional dual-in-line I.C.

In FIG. 1 an example of the pin arrangement of a conventional dual-in-line I.C. is shown. The Figure shows a SRAM I.C., comprising an integrated circuit chip 100 encapsulated within an encapsulation 112, that has been drawn partially for the sake of clarity. The chip 100 is provided with bonding pads such as 114 and 116, located near the edges of chip 100. The bonding pads shown are connected via conductive connections, e.g. bonding wires, such as 122 and 124, to the connection pins 1-24 extending beyond the encapsulation 112. The connection pins 1-24 and the bonding wires such as 122 and 124 couple the chip 100 to the external world. The chip 100 is supplied with a supply voltage $V_{CC}$ via supply pin 24 and bonding wire 124, and with a supply voltage GND via supply pin 12 and bonding wire 122. In accordance with the widely accepted standard, supply pins 12 and 24 are placed diametrically opposite to each other. Connection pins 9-11 and 13-17 are input-/output pins for data transport. Connection pins 1-8, 19, 22 and 23 are address pins. Connections 18, 20, and 21 serve as control pins for controlling the chip 100 with a chip-select signal, an output-enable signal and a write-enable signal, respectively.

As can be seen in the drawing the locations of the bonding pads, among which are pads 114 and 116, correspond circumferentially with the locations of the connection pins 1-24. As a consequence of this set up the electrical path length of the supply arrangement, comprising supply pin 12 and bonding wire 122, and supply pin 24 and bonding wire 124, is the longest possible among all series connections of a connection pin and its associated bonding wire present.

Another consequence is that, because of the supply pins 12 and 24 being disposed diametrically opposite to each other, the distance between said pins 12 and 24 is the longest possible between any pair of connection pins.

This architectures several drawbacks. First since the electrical path length of the series arrangement of supply pin 12 and bonding wire 122 and the electrical path length of the series arrangement of supply pin 24 and bonding wire 124 are the longest present, the inductance of each of said series arrangements is the largest present. In the operating mode of the I.C., large and rapidly varying currents are conducted by said supply pins 12 and 24 and the associated bonding wires 122 and 124. Therefore, since both the current changes and the inductances are large, inductance voltage spikes are liable to occur on the supply pins 12 and 24 and the associated bonding wires 122 and 124. The spikes then are propagated onto the internal supply lines of the chip. Because of the large electrical path lengths mentioned hereinbefore, the voltage spikes generated on the supply pin and the bonding wire may be in the same order of magnitude as voltage spikes generated on the chip's internal supply lines (not shown).

In order to reduce the amplitude of the voltage spikes and the interference of said voltage spikes with other information carrying signals a smoothing capacitor 126 is connected between the supply pins 12 and 24. Another drawback of the conventional architecture emanates from the connection of this capacitor 26. As the supply pins 12 and 24 are located diametrically opposite to each other the smoothing capacitor 26 has to be connected there-between by means of relatively long wires. This implies a presence of a loop of conductors, comprising the capacitor's 26 wires, the supply pins 12 and 24 and the bonding wires 122 and 124, the relatively large area thereof allowing further inductive effects, interfering the operation of the I.C. or with other circuitry in the I.C.'s neighbourhood (not shown). Also, the long wires' impedance may cause delays, thereby reducing the capacitor's 26 effect.

As the miniaturization of the I.C.'s proceeds and the maximum clock frequency possible tends to increase further, the inherent drawbacks of the conventional pinning system become even more apparent. As a consequence of ever decreasing scales and ever increasing clock frequencies the inductive voltage spikes are more liable to have detrimental effects on the chip itself, e.g. they may give rise to the breakdown of transistors. Therefore, unless the current changes on the supply are adapted to the limitations of the conventionally pinned I.C., which implies among other things a relatively low maximum clock frequency and as a consequence a low operation speed, a safe operation of the I.C. is not possible anymore.

Figure 2:
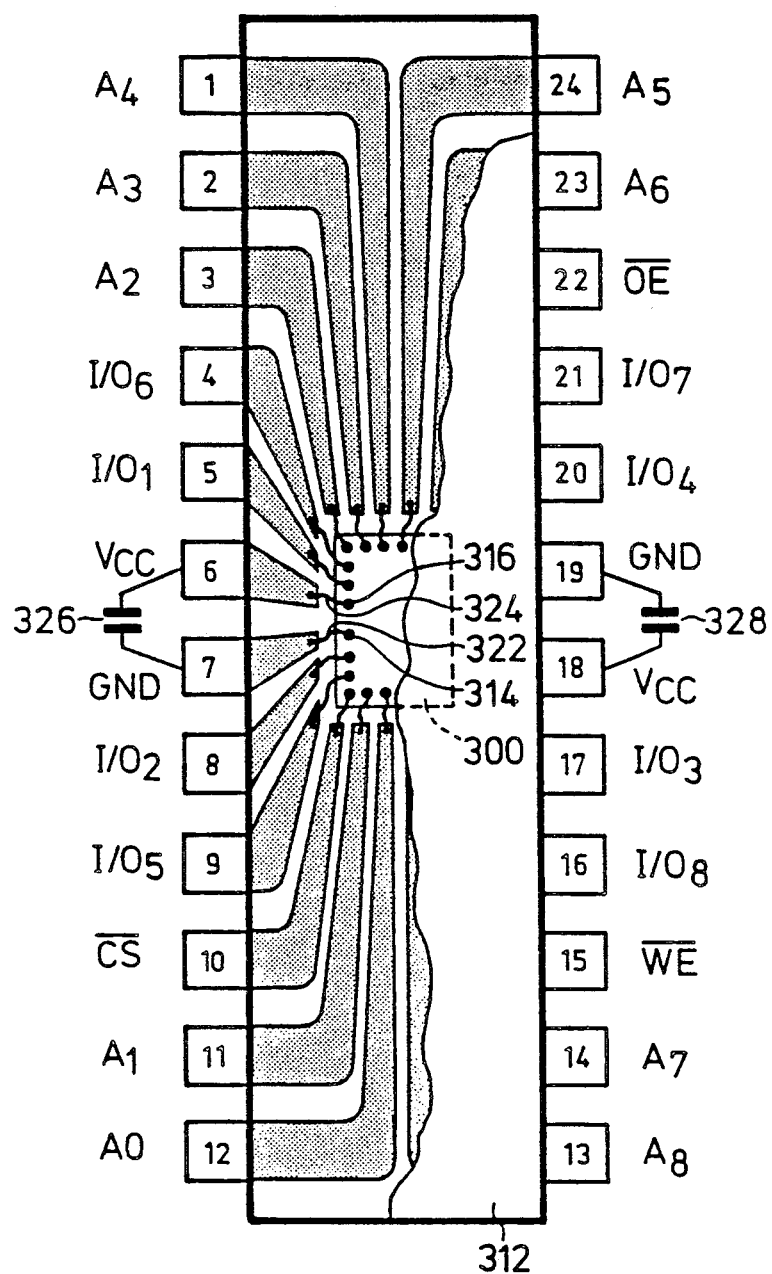
FIG. 2 presents the pin arrangement in accordance with the invention of a dual-in-line I.C.

In FIG. 2 the pin arrangement of an I.C. according to the invention is presented by way of an example. The Figure shows a SRAM I.C., comprising an integrated circuit chip 300 encapsulated within an encapsulation 312, that has been drawn only partially for clarity. The chip 300 is provided with bonding pads, such as 314 and 316, that are located near the edges of the chip 300. The bonding pads are connected via bonding wires, such as 322 and 324, to the connection pins 1-24, extending beyond the encapsulation 312. The chip 300 is supplied with a supply voltage $V_{CC}$ via supply pins 6 and 18, and with a supply voltage GND via supply pins 7 and 19. In contrast to the pin arrangement shown in the previous Figure, the supply pins 6 and 7 (and 18 and 19) now are disposed in such a manner as to minimize the respective aggregated electrical path length of the respective supply pin and its associated bonding wire. To this end, the supply pins 6 and 7 on the one hand and the supply pins 18 and 19 on the other hand are located centrally within their associated sequences of connection pins. By minimizing said electrical path length, the aggregated inductance of the series arrangement of a supply pin and its associated bonding wire is reduced considerably with respect to the aggregated inductance present in the corresponding supply pin and bonding wire of the conventionally pinned I.C. of the previous Figure.

By locating the supply pins for $V_{CC}$ and GND next to each other, like pins 6 and 7 (and pins 18 and 19), a smoothing capacitor 326 (328) can be connected therebetween using very short connecting wires. The loop, formed by the two supply pins 6 and 7, the bonding wires 322 and 324, chip 300 and capacitor 326 now has an extremely short circumference and an extremely small area enclosed thereby. The wires now connecting capacitor 326 (328) to the supply pins have a much smaller impedance than in the case shown in FIG. 1, which increases the capacitor's effect. Moreover, the area of said loop is much smaller than in the case of the previous Figure, which implies a much smaller loop-inductance, and therefore a much lower susceptibility to e.g. externally generated electromagnetic fields. If space will permit the smoothing capacitor 326 (e.g. a surface mounted device) may be connected between the relevant supply pins inside of the encapsulation 312 or may be integrated within the supply pins themselves.

Another advantage of the supply pin arrangement having a $V_{CC}$-pin in the immediate proximity of a GND-pin is the reduction of the effective aggregated inductances of the supply pins and the associated bonding wires. This reduction is caused by the anti-parallel orientation of the currents conducted in the conductors each comprising a supply pin and an associated bonding wire. The mutual inductance generated by anti-parallel oriented currents in two conductors disposed parallel to each other causes the effective inductance of the parallel arranged conductors to be less than half of the inductance of a single conductor.

The shown I.C. further is provided with two supply pins 6 and 18 for supply voltage $V_{CC}$ and two supply pins 7 and 19 for supply voltage GND. The current conducted per supply pin now is halved with respect to the case shown in FIG. 1, which further reduces the amplitude of inductive voltage spikes.

The locations of the $V_{CC}$ pins 6 and 18 and of the GND pins 7 and 19 are chosen to be rotationally symmetrical as can be seen from the drawing. A mirror-symmetrical arrangement of the supply pins could lead to the destruction of the I.C. in case it would unintentionally be inserted into a circuit board the other way around, that is in the drawing upside down.

As can be seen from FIG. 2 output pins 5, 8, 17 and 20 are located next to a supply pin. Said output pins are externally accessible terminals, coupled to outputs of the on-chip output buffers (not shown). The arrangement of output pins next to supply pins has several advantages. First, the length of the electrical path constituted by an output pin and its associated bonding wire is in the same order of magnitude as, or equal to, the length of the electrical path constituted by a supply pin and its associated bonding wire. Consequently, the impedance (inductance) of the former is equally low. Second, the output buffers are located in the margin of chip 300. Because of the buffers' locations near the bonding pads for connection to the supply terminals and for connection to the output pins, the buffers are suppled via short on-chip supply lines (not shown). Short supply lines are advantageous for output buffers in particular, since they generally switch large current that may cause inductive voltage spikes on the associated supply lines. If the supply lines are kept as short as possible, the inductance thereof will be equally low.

The control pin 10 for the chip-select signal, the control pin 15 for the write-enable signal and the control pin 22 for the output-enable are disposed beyond the output pins in their associated sequences of connection pins. The set of supply pins 6, 7, 18, 19, the output pins 4, 5, 8, 9, 16, 17, 20, 21 and the control pins 10, 15, 22 forms a core of frequently occurring pins in a memory I.C. For another type of I.C., for instance a microcontroller, another set of control pins may be arranged as the specific application of the I.C. may require. The concentration of said supply pins, output pins and control pins into a core, and dividing the chip into core circuitry and additional circuitry, has several advantages. First, the I.C. is less sensitive to inductive voltage spikes as already has been discussed herein above. Second, the core of standard connection pins offers a starting point for I.C.-designers that is common to various lay-outs and from whereon extensions are relative easy to make.

In the FIG. 2 the address pins 1, 2, 3, 11, 12, 13, 14, 23, 24 are located beyond the control pins and the output pins. For memory designers in particular this dividing in core-circuitry and additional circuitry has the advantage that memories with various capacities may use identical cores, less sensitive to the above mentioned inductive interferences.

Figure 3:
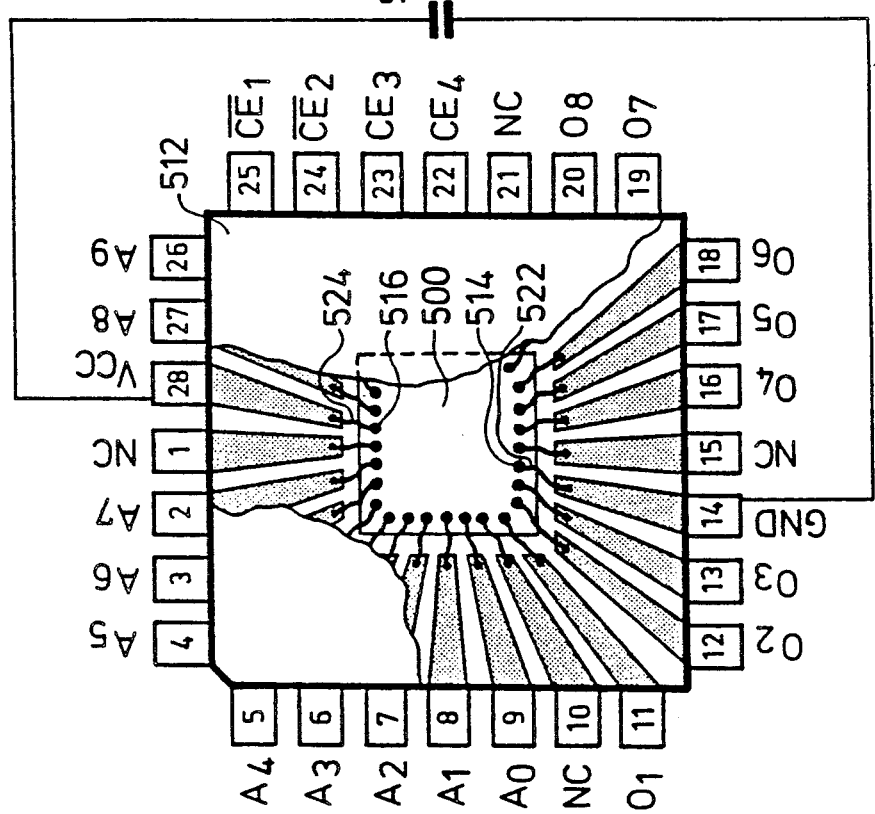
FIG. 3 shows the pin arrangement of a conventional I.C. having pins disposed circumferentially.

In FIG. 3 an example is shown of the pin arrangement for a conventional memory I.C. having connection pins located along its circumference. The I.C. comprises an integrated circuit chip 500 encapsulated within encapsulation 512, which has been drawn only partially for clarity. The chip 500 is provided with bonding pads such as 514 and 516, located near the chip's 500 edges. The bonding pads are connected to the connection pins, such as 14 and 28 via bonding wires, such as 522 and 524. Connection pins 28 and 14 are supply pins for receiving supply voltages $V_{CC}$ and GND, respectively. Connection pins 1, 10, 15 and 21 are not connected. Connection pins 11-13 and 16-20 are output pins, connections 2-9, 26 and 27 are address pins and connection pins 22-24 are control pins for receiving various chip-enable signals, which are included for the ease of memory expansion.

As can be seen, the supply pins 14 and 28 have not the best possible location in view of the reduction of inductive interferences. First, they are not the shortest possible connection pins, for pins 1 and 15 are shorter but are not connected. Second, the supply pins are located on opposite sides of the I.C. Smoothing capacitor 526 is to be connected between the supply pins 28 and 14 using wire that bridge the long distance across the I.C. What has been further described with reference to the I.C. of FIG. 1 with regard to the drawbacks of the pin arrangement will apply equally to the I.C. of FIG. 3.

Figure 4:
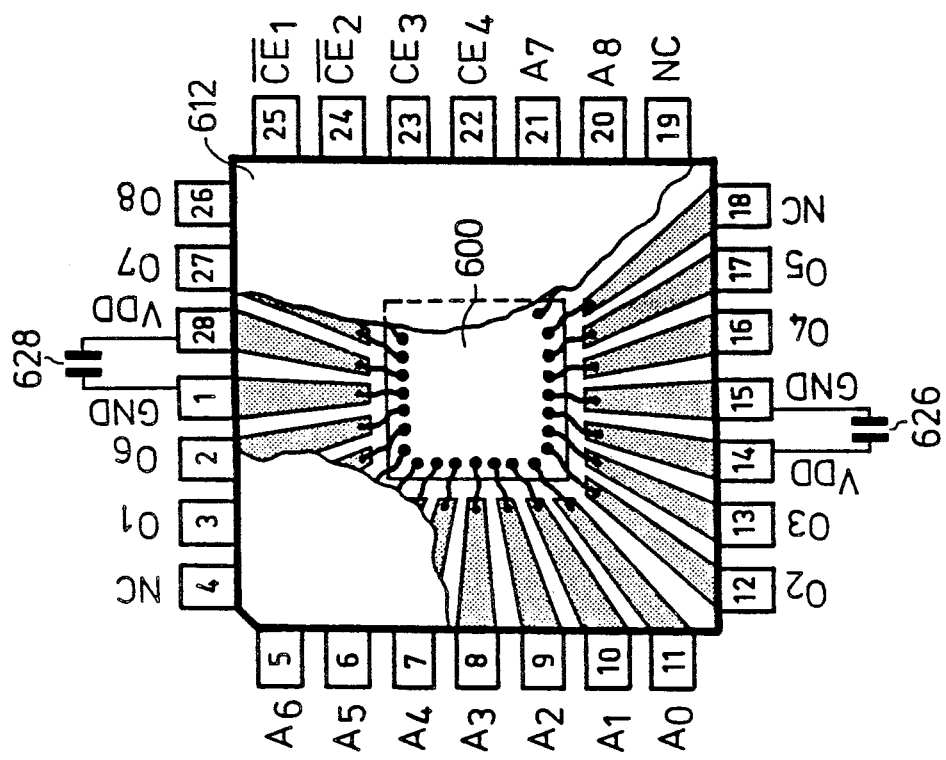
FIG. 4 shows the pin arrangement of an I.C. having pins disposed circumferentially in accordance with the invention.

In FIG. 4 an example of the pin arrangement for an I.C. having its pins disposed circumferentially is shown. The Figure shows an integrated circuit chip 600 within an encapsulation 612. The $V_{DD}$ supply pins 14 and 28 now are located next to a GND supply pin 15 and 1, respectively. Furthermore, the arrangement of a $V_{DD}$ supply pin next to a GND supply pin is located centrally in a relevant sequence of connection pins, that is, the arrangement is flanked by other connection pins on both sides, the number of other connection pins being approximately equal for both sides. Smoothing capacitors 626 and 628 have been connected between supply pins 14 and 15 and supply pins 1 and 28, respectively, via short wires. The output pins 12, 13 and 16, 17 are disposed next to the arrangement of supply pins 14 and 15. The output pins 3, 2 and 27, 26 are disposed next to the arrangement of supply pins 1 and 28. The connection pins 22-25 constitute the control pins for various chip-enable signals, the connection pins 5-11, 20 and 22 constitutes the address pins.

Although the above examples refer to memories, similar pin-arrangements could be made for other kind of circuits, e.g. microcontroller. Likewise, similar arrangements are possible for integrated circuit modules comprising more than a single chip, which pin-arrangements similarly reflect the object of the invention to reduce the inductive voltage spikes by pairing the supply pins in the nearest proximity of the chips, and by disposing output pins next to the supply pins in the respective connection pin-arrangements.

What is claimed is:
1. An integrated circuit device comprising:
   (a) an integrated circuit,
   (b) a plurality of external connection pins extending from the device,
   (c) a plurality of conductive connections coupling said integrated circuit respectively to said connection pins,
   (d) wherein among said connection pins there are at least a first supply pin and second supply pin,
   (e) at least one output signal pin,
   (f) at least one pin not being a supply pin or an output pin,
   (g) said first supply pin and second supply pin being next to each other and an output signal pin being next to one of said supply pins, the first supply pin being for connection to a first supply voltage and the second supply pin being for connection to a second supply voltage different from the first supply voltage, and
   (h) wherein an aggregated electrical path length of each and every supply pin and its respective conductive connection is equal to or shorter than an aggregated electrical path length of any of the connection pins not being a supply pin and its respective conductive connection.

2. The device of claim 1, wherein an aggregated electrical path length of each and every output pin and its respective conductive connection is equal to or shorter than an aggregated electrical path length of any of the connection pins not being a supply pin or an output pin and its respective conductive connection.

3. The device of claim 1, wherein among said connection pins there are at least two output signal pins, one of said output signal pins being next to said first supply pin and the other of said output signal pins being next to said second supply pin.

4. The device of claim 2, wherein among said connection pins there are at least two output signal pins, one of said output signal pins being next to said first supply pin and the other of said output signal pins being next to said second supply pin.

5. A circuit element comprising:
   (a) an integrated circuit on a semiconductor substrate having bonding pads for connection to connection pins via conductive connections,
   (b) there being among said bonding pads a plurality of supply bonding pads including one or more pairs of adjacent supply bonding pads, each pair for receiving a supply voltage difference,
   (c) one or more output signal bonding pads each for providing a respective output signal from said circuit,
   (d) one or more other bonding pads, each of said other bonding pads being neither a supply bonding pad nor an output bonding pad, and
   (e) at least one of said output bonding pads being adjacent one of said supply bonding pads.

6. The circuit element of claim 5, wherein each output bonding pad is adjacent a supply bonding pad or another of said output bonding pads.

7. The circuit element of claim 5, wherein one of said supply bonding pads to which one of said output bonding pads is adjacent is one supply bonding pad of one pair, the other supply bonding pad of said one pair is adjacent another of said output bonding pads.

8. The circuit element of claim 6, wherein one of said supply bonding pads to which one of said output bonding pads is adjacent is one supply bonding pad of one pair, the other supply bonding pad of said one pair is adjacent another of said output bonding pads.

9. An integrated circuit module, comprising:
   (a) a first plurality of sequences of connection pins,
   (b) an integrated circuit chip having a second plurality of series of bonding pads, in one-to-one associative relationship with said connection pins, a respective interconnection between each said bonding pad and the associated connection pin comprising a respective bonding wire;
   (c) among said connection pins there being one or more groups of pins consisting of a pair of adjacent supply pins and an output signal pin adjacent one of said pair of supply pins,
   (d) said pair of adjacent supply pins comprising a first supply pin for receiving a first supply voltage and a second supply pin for receiving a second supply voltage different from the first supply voltage,
   (e) wherein every of said groups of pins is substantially centrally disposed in an associated sequence, and is interconnected by a respective group of bonding wires to an associated group of adjacent bonding pads that is likewise substantially centrally disposed in an associated series, (f) said associated sequence and said associated series being located alongside each other.

10. An integrated circuit module, comprising:
   (a) a first plurality of sequences of connection pins,
   (b) an integrated circuit chip having a second plurality of series of bonding pads, in one-to-one associative relationship with said connection pins, a respective interconnection between each said bonding pad and the associated connection pin comprising a respective bonding wire,
   (c) among said connection pins there being one or more groups of pins consisting of a pair of adjacent supply pins and and a pair of output signal pins adjacent different ones of said pair of supply pins,
   (d) said pair of adjacent supply pins comprising a first supply pin for receiving a first supply voltage and a second supply pin for receiving a second supply voltage different from the first supply voltage,
   (e) wherein every of said groups of pins is substantially centrally disposed in an associated sequence, and is interconnected by a respective group of bonding wires to an associated group of adjacent bonding pads that is likewise substantially centrally disposed in an associated series,
   (f) said associated sequence and said associated series being located alongside each other.

11. The device of claim 3 wherein each particular output pin is located nearer to the supply pin closest to the particular output pin than any other pin not being a supply pin nor output pin.

12. The device of claim 1, wherein the device further comprises at least one data input pin for receiving a data input signal and at least one control pin for receiving a control signal for controlling an operation by the circuit on the data input signal, and wherein each control pin is located between at least one output signal pin and a data input pin.

13. The device of claim 1 wherein the first supply pin and the second supply pin are disposed in a first ordered arrangement, the device further comprising a third supply pin and a fourth supply pin for receiving the first supply voltage and the second supply voltage respectively, and wherein said third and fourth supply pins are disposed in a second ordered arrangement that is located rotationally symmetrical with respect to the first ordered arrangement in a plane substantially through the first and second ordered arrangements.

14. The device of claim 12 comprising a memory circuit.

15. The circuit element of claim 5 wherein the element further comprises at least one data input pad for receiving a data input signal and at least one control pad for receiving a control signal for controlling an operation by the circuit on the data input signal and wherein the control pad is located between the output pad and the data input pad.

16. The circuit element of claim 5 wherein a first pair of supply pads are disposed in a first ordered arrangement, the device further comprising a second pair of supply pads for receiving the same voltage difference as the first pair, and wherein the second pair of supply pads are disposed in a second ordered arrangement that is located rotationally symmetrical with respect to the first ordered arrangement in a plane substantially through the first and second ordered arrangements.

17. The circuit element of claim 15 comprising a memory circuit.

18. An integrated circuit device comprising:
   (a) an integrated circuit element.
   (b) at least a first sequence of external connection pins connected to the element and extending from the device, said connection pins including
      at least a first supply pin and second supply pin for receiving a supply voltage difference,
      at least a first output signal pin and a second output signal pin each for providing respective output signals,
      at least a first data input pin and a second data input pin each for receiving respective data input signals, and
      at least a first control pin and a second control pin each for receiving a respective control signal for controlling an operation by the circuit on the data input signals,
   (c) said sequence comprising the first supply pin located next to the second supply pin,
      the supply pins being located between the first output signal pin and the second output signal pin,
      the output signal pins being located between the first control pin and the second control pin, and
      the control pins being located between the first data input pin and the second data input pin.

19. The device of claim 18 comprising a second sequence of connection pins same as the first wherein the second sequence of pins are located rotationally symmetrical with respect to the first sequence of pins in a plane substantially through the first and second sequences.

20. A circuit element comprising:
   (a) an integrated circuit on a semiconductor substrate having at least one sequence of bonding pads,
   (b) said bonding pads including
      at least a first supply pad and second supply pad for receiving a supply voltage difference,
      at least a first output signal pad and a second output signal pad each for providing respective output signals,
      at least a first data input pad and a second data input pad each for receiving respective data input signals, and
      at least a first control pad and a second control pad each for receiving a respective control signal for controlling an operation by the circuit on the data input signals,
   (c) said sequence comprising the first supply pad located next to the second supply pad,
      the supply pads being located between the first output signal pad and the second output signal pad,
      the output signal pads being located between the first control pad and the second control pad, and
      the control pads being located between the first data input pad and the second data input pad.

21. The circuit element of claim 20 comprising a second sequence of bonding pads same as the first wherein the second sequence of pads are located rotationally symmetrical with respect to the first sequence of pads in a plane substantially through the first and second sequences.

22. An integrated circuit device comprising:
   (a) an integrated circuit;

(b) a plurality of external connection pins extending form the device,
(c) a plurality of conductive connections coupling said integrated circuit respectively to said connection pins,
(d) wherein among said connection pins there are at least a first supply pin and second supply pin,
(e) at least one output signal pin,
(f) at least one pin not being a supply pin or an output pin,
(g) said first supply pin and second supply pin being next to each other and an output signal pin being next to one of said supply pins, the first supply pin being for connection to a first supply voltage and the second supply pin being for connection to a second supply voltage different from the first supply voltage, and
(h) wherein an aggregated electrical path length of at least one supply pin and its respective conductive connection is equal to or shorter than an aggregated electrical path length of any of the connection pins not being a supply pin and its respective conductive connection.

* * * * *